(12) United States Patent
Meagley

(10) Patent No.: US 7,611,828 B2
(45) Date of Patent: Nov. 3, 2009

(54) PHOTOACTIVE ADHESION PROMOTER

(76) Inventor: Robert P. Meagley, 18329 SW. Forest Park Rd., Hillsboro, OR (US) 97123

( * ) Notice: Subject to any disclaimer, the term of this patent is extended or adjusted under 35 U.S.C. 154(b) by 0 days.

(21) Appl. No.: 12/277,114

(22) Filed: Nov. 24, 2008

(65) Prior Publication Data

US 2009/0076291 A1    Mar. 19, 2009

Related U.S. Application Data

(63) Continuation of application No. 10/288,021, filed on Nov. 4, 2002, now Pat. No. 7,501,230.

(51) Int. Cl.
*G03F 7/00* (2006.01)
*G03F 7/004* (2006.01)
*C07F 7/02* (2006.01)

(52) U.S. Cl. .................. 430/327; 430/270.1; 556/400; 556/465

(58) Field of Classification Search ................ 556/400, 556/465; 430/270.1, 327
See application file for complete search history.

(56) References Cited

U.S. PATENT DOCUMENTS

| | | |
|---|---|---|
| 5,366,852 A | 11/1994 | Pavelcheck et al. |
| 5,380,889 A | 1/1995 | Hanawa et al. |
| 5,747,622 A | 5/1998 | Maeda et al. |
| 6,274,289 B1 | 8/2001 | Subramanian et al. |
| 6,503,689 B2 | 1/2003 | Zampini et al. |
| 6,528,235 B2 | 3/2003 | Thackeray et al. |
| 6,537,908 B2 | 3/2003 | Fornof et al. |
| 6,566,030 B2 | 5/2003 | Grober et al. |
| RE38,282 E | 10/2003 | Allen et al. |
| 6,764,808 B2 | 7/2004 | Okoroanyanwu et al. |
| 6,890,448 B2 | 5/2005 | Pavelcheck |
| 6,927,009 B2 | 8/2005 | Kodama et al. |
| 2004/0039153 A1 | 2/2004 | Elce et al. |
| 2004/0161711 A1 | 8/2004 | Rushkin et al. |

OTHER PUBLICATIONS

Office Action from U.S. Appl. No. 10/917,679, now abandoned, mailed Feb. 9, 2005, 7 pgs.
Office Action from U.S. Appl. No. 10/917,679, now abandoned, mailed Aug. 8, 2005, 5 pgs.
Office Action from U.S. Appl. No. 10/917,679, now abandoned, mailed Jan. 24, 2006, 4 pgs.
Office Action from U.S. Appl. No. 10/288,021, mailed Nov. 30, 2004, 6 pgs.
Office Action from U.S. Appl. No. 10/288,021, mailed Jul. 6, 2005, 8 pgs.
Office Action from U.S. Appl. No. 10/288,021, mailed Feb. 14, 2006, 6 pgs.
Office Action from U.S. Appl. No. 10/288,021, mailed Jul. 27, 2007, 6 pgs.
Office Action from U.S. Appl. No. 10/288,021, mailed Jan. 10, 2008, 7 pgs.

*Primary Examiner*—Amanda C. Walke
(74) *Attorney, Agent, or Firm*—Blakely, Sokoloff, Taylor & Zafman LLP

(57) ABSTRACT

An adhesion promoter to help reduce semiconductor process effects, such as undesired line edge roughness, insufficient lithographical resolution, and limited depth of focus problems associated with the removal of a photoresist layer. A photoactive adhesion promoter (PAG) is described which helps reduce these and other undesired effects associated with the removal of photoresist in a semiconductor manufacturing process.

15 Claims, 4 Drawing Sheets

PHOTOACTIVE ADHESION PROMOTER

The present continuation application is related to, incorporates by reference and hereby claims the priority benefit of pending U.S. patent application Ser. No. 10/288,021, filed Nov. 4, 2002 now U.S. Pat. No. 7,501,230.

FIELD

Embodiments of the invention relate to the field of semiconductor manufacturing. More particularly, embodiments of the invention relate to a photoactive adhesion promoter to facilitate solubility of photoresist on a semiconductor wafer.

BACKGROUND

As feature sizes continue to decline in modern photolithographical semiconductor manufacturing processes, effects, such as undesired line edge roughness, insufficient lithographical resolution, and limited depth of focus problems can increase. More particularly, photoresist image footprints may become increasingly difficult to control as semiconductor device features become smaller and closer together.

Adhesion promoters may be used to bond the photoresist to the semiconductor substrate or other device surface until the photoresist is exposed to light, thereby defining feature edges and boundaries within the device. Photoresist, however, may persist around the substrate surface and photoresist interface. This is because some regions toward the bottom of the photoresist may not become sufficiently soluble after being exposed to an incident radiation to be completely removed, and instead remain bonded to the substrate by the adhesion promoter. These areas of persisting photoresist may correspond to areas where an incident radiation signal is weakest due to radiation absorption by photoresist or reflective interaction effects between the substrate and photoresist.

FIG. 1 illustrates a prior art adhesion promoter. The adhesion promoter of FIG. 1 is a Hexamethydisilyazide (HMDS) adhesion promoter and serves to help bond the photoresist layer to the underlying substrate. Accordingly, the adhesion promoter is removed along with the photoresist layer after being exposed to incident radiation.

FIG. 2 illustrates a prior art process for forming an adhesion promoter and photoresist layer on a semiconductor substrate. The prior art adhesion promoter of FIG. 1 is applied to a semiconductor substrate, followed by a photoresist layer being applied superjacent to the adhesion promoter. A mask layer is applied, exposing the photoresist layer to incident ultra-violet light in areas that are not covered by the mask layer. These process steps may also be applied to other layers of a semiconductor die.

The result of the above-described process step can be illustrated by the example of FIG. 3. FIG. 3 is a photograph of a line-spacing pattern illustrating roughness and poorly defined edges associated with a typical photoresist removal process. Particularly, FIG. 3 illustrates photoresist deposits persisting between device features after being exposed to an incident radiation, such as ultra-violet light.

BRIEF DESCRIPTION OF THE DRAWINGS

Embodiments and the invention are illustrated by way of example and not limitation in the figures of the accompanying drawings, in which like references indicate similar elements and in which.

DETAILED DESCRIPTION

Embodiments of the invention described herein help reduce semiconductor process effects, such as undesired line edge roughness, insufficient lithographical resolution, and limited depth of focus problems associated with the removal of a photoresist layer. More particularly, embodiments of the invention use a photoactive adhesion promoter ("PAG") to help reduce these and other undesired effects associated with the removal of photoresist in a semiconductor manufacturing process.

For at least one embodiment of the invention, these undesired effects are reduced by improving lithographical image fidelity at the region around the interface of the adhesion promoter and the photoresist layer. The optical signal incident to the exposed photoresist (those regions not covered by the mask layer) is effectively amplified at the adhesion promoter-photoresist interface region by allowing radiation incident to the exposed photoresist layer to be used more efficiently, thereby increasing the solubility of the photoresist in the interface region.

Embodiments of the invention increase solubility of the photoresist layer in the adhesion promoter-photoresist interface region by using a photoactive adhesion promoter that releases a substance to enhance solubility of the photoresist in the interface region when exposed to an incident radiation, such as ultra violet light.

For one embodiment, the substance is an acid that contacts the photoresist, thereby increasing the photoresist's solubility so that it can be removed more effectively. For other embodiments, the substance is a base, which would have the opposite effect upon the interface region from an acid. The choice of whether to use an acid or a base is dependent upon the particular patterning and/or resist requirements of the application. Furthermore, a combination of acid and base may be used in a photoactive adhesion promoter to further facilitate control of feature profile in the exposed adhesion promoter-photoresist interface region. Other types of photoactive adhesion promoters may be blended with others for even greater diversity in feature control.

Figure 1:
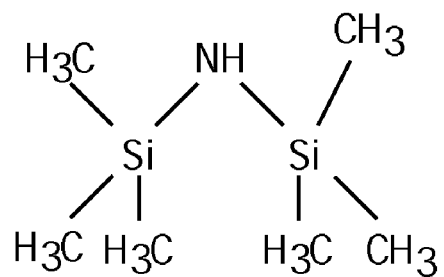
FIG. 1 illustrates a prior art adhesion promoter.
Figure 2:
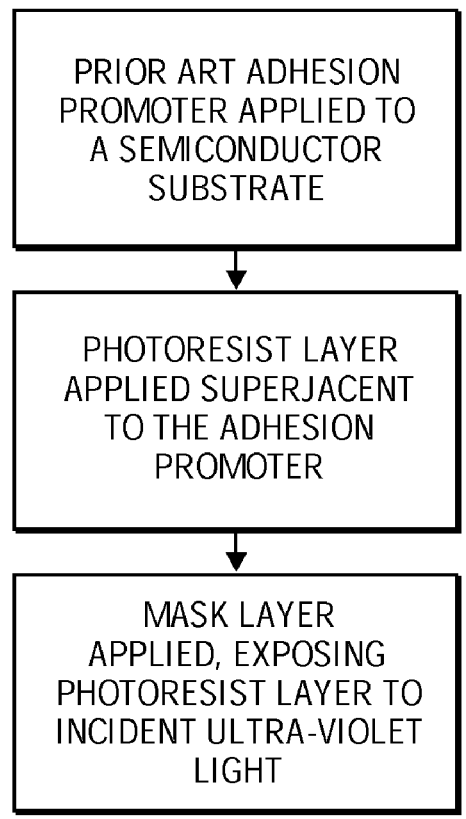
FIG. 2 illustrates prior art process steps for forming an adhesion promoter and photoresist layer on a semiconductor substrate.
Figure 3:
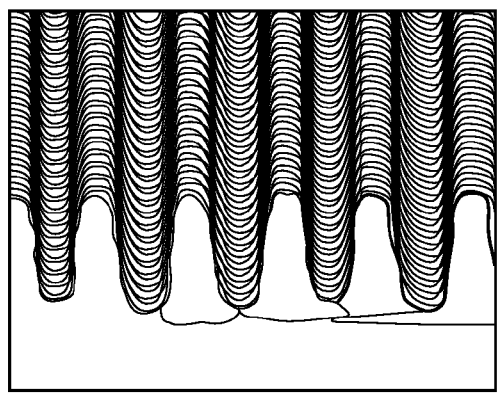
FIG. 3 is a photograph of a line-spacing pattern illustrating roughness and poorly defined edges associated with a typical photoresist removal process.
Figure 4:
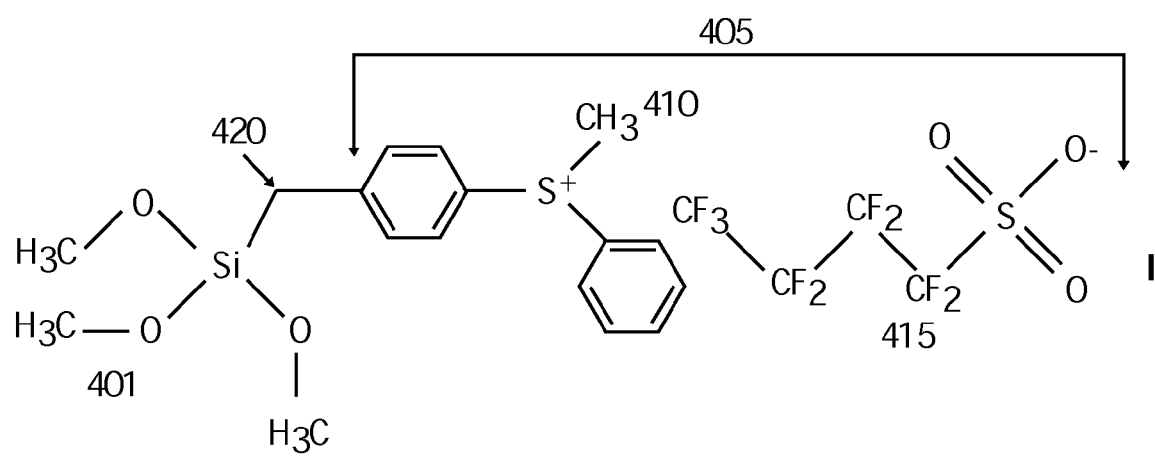
FIG. 4 illustrates a photoactive adhesion promoter according to one embodiment of the invention.

FIG. 4 illustrates a photoactive adhesion promoter ("PAG") according to one embodiment of the invention. The example of FIG. 4 illustrates a system that is capable of attaching a PAG to a semiconductor wafer as a self-assembled layer. The layer is bound to the wafer through the reaction of the trialkoxysilane with pendant groups, such as Si—OH groups and $S_1$—$NH_2$ groups, on the wafer surface, thereby forming silylether linkages. These linkages are covalent bonds that attach a photon harvesting group and a catalyst to the wafer surface.

The PAG of FIG. 4 comprises an adhesion promoter 401 and a photoacid generator 405. The photoacid generator comprises a photon harvesting group 410 and a catalyst group 415. In the embodiment illustrated in FIG. 4, the adhesion promoter is trimethoxysilane, the photon harvesting group is methyldiphenylsulfonium, and the catalyst group is nonafluorobutanesulfonate. In addition, a linker 420 bonds the adhesion promoter to the photon harvesting group.

The adhesion promoter, photon harvesting group, and the catalyst group may comprise different compounds as well. For example, the adhesion promoter may comprise alkoxysilane, silylchloride (a subclass of silylhalide), phosphate, phosphonate, alkene, thiol, or sulfide.

The photon harvesting group may comprise sulfonium salts, such as triarylsulphonium. Triarylsulphonium is a general class, in which aryl represents any structure with an aromatic group bound to the sulfur atom as well as functionalized aryl groups where functionalization may be heteroatoms, such as fluorine, chlorine, bromine, and functional groups such as alcohol (OH), nitro ($NO_2$), amine ($R_3N$), amide ($R_2NC(O)R$), carboxylic acid (RCOOH), ester (RCOOR), ether (ROR), carbonate (ROC(O)OR).

Furthermore, alkyldiarylsulfonium and dialkylarylsulfonium are a general class of sulfonium salts which may be used, in which aryl is defined as above and alkyl is a hydrocarbon group, such as $(CH_2)_nCH_3$ where n=0 to 11, as well as functionalized hydrocarbon groups, in which functionalization may be heteroatoms, such as fluorine, oxygen, nitrogen, chlorine, bromine and functional groups such as alcohol (OH), nitro ($NO_2$), amine ($R_3N$), amide ($R_2NC(O)R$), carboxylic acid (RCOOH), ester(RCOOR), ether (ROR), or carbonate (ROC(O)OR). Alternatively, the photon harvesting group may comprise iodonium salts, such as diaryl and alkyaryl, in which aryl and alkyl are as defined above.

The catalyst group may comprise alternative compounds, such as perfluoroalkylsulfonate, alkylsulfonate, arylsulfonate, alkyl and aryl phosphate, or fluoroalkylamide.

For the embodiment illustrated in FIG. 4, the linker is methylene. However, other compounds may be used, such as alkyl, which may include ethers, esters, carbonates, amides, amines as elements of chains or side groups, wherein the side groups may also including halogen, alcohol, and nitrile. Alternatively, aryl may be used for the linker, which may include functionalized aryl groups, which may be heteroatoms such as fluorine, chlorine, bromine, as well as functional groups such as alcohol (OH), nitro ($NO_2$), amine ($R_3N$), amide ($R_2NC(O)R$), carboxylic acid (RCOOH), ester (RCOOR), ether (ROR), or carbonate (ROC(O)OR).

By incorporating a PAG into an adhesion promoter, the adhesion promoter-photoresist interface region becomes doped with acid when exposed to light. This effectively amplifies the acid-catalyzed reaction within the photoresist. For the embodiment illustrated in FIG. 4, the effect is catalytic, whereas in other embodiments the effect may be accomplished using other methods. The acid generated by the PAG also disrupts adhesion in areas of positive tone resist where the photoresist is to be dissolved away after exposure to light. Advantageously, the photoacid generator in the adhesion promoter confers an anti-reflective quality to the surface upon which it is applied, thereby muting radiation swing effects at the edges of the exposed region. By modulating surface energy differences between the photoresist and the substrate, the photoresist solubility at the resist-substrate interface and the optical properties of the interface are enhanced.

Figure 5:
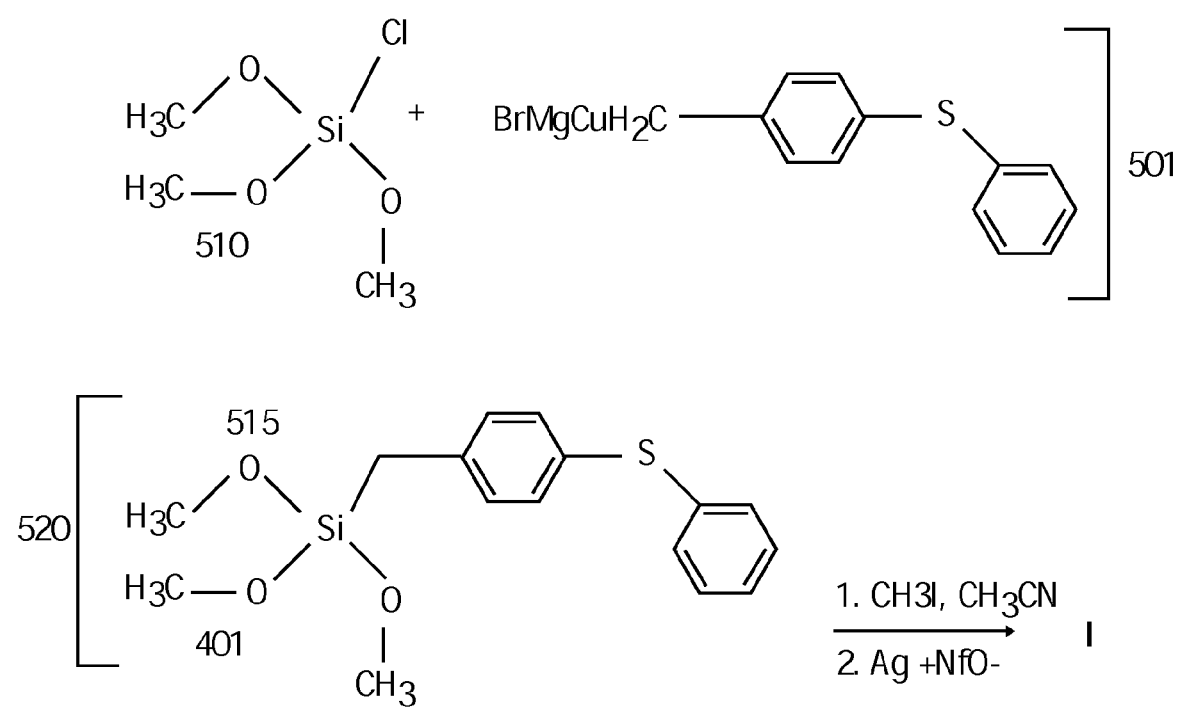
FIG. 5 illustrates the steps for creating a photoactive adhesion promoter according to one embodiment of the invention.

FIG. 7 illustrates a chemical structure of two other linkers that may be used in conjunction with at least one embodiment of the invention. Specifically, FIG. 7 illustrates a flexible linker 701 and a rigid linker 705. The choice of which linker to use depends upon the needs of the device in which its used. FIG. 5 illustrates a method for creating a photoactive adhesion promoter according to one embodiment of the invention. For the embodiment of the invention illustrated in FIG. 5, an alkylsiloxane 501 is formed from combining bromomagnesiummethylphenylphenylsulfide 505 and trimethoxysilylchloride 510 and treating the alkylsiloxane with methyliodide 515 to form a sulfonium siloxane species 520. Furthermore, an ion exchange occurs as a result of a silver salt of a nonafluorosulfonic acid being formed by the above combination. Once the adhesion promoter is formed it can be purified by recrystallization.

Figure 6:
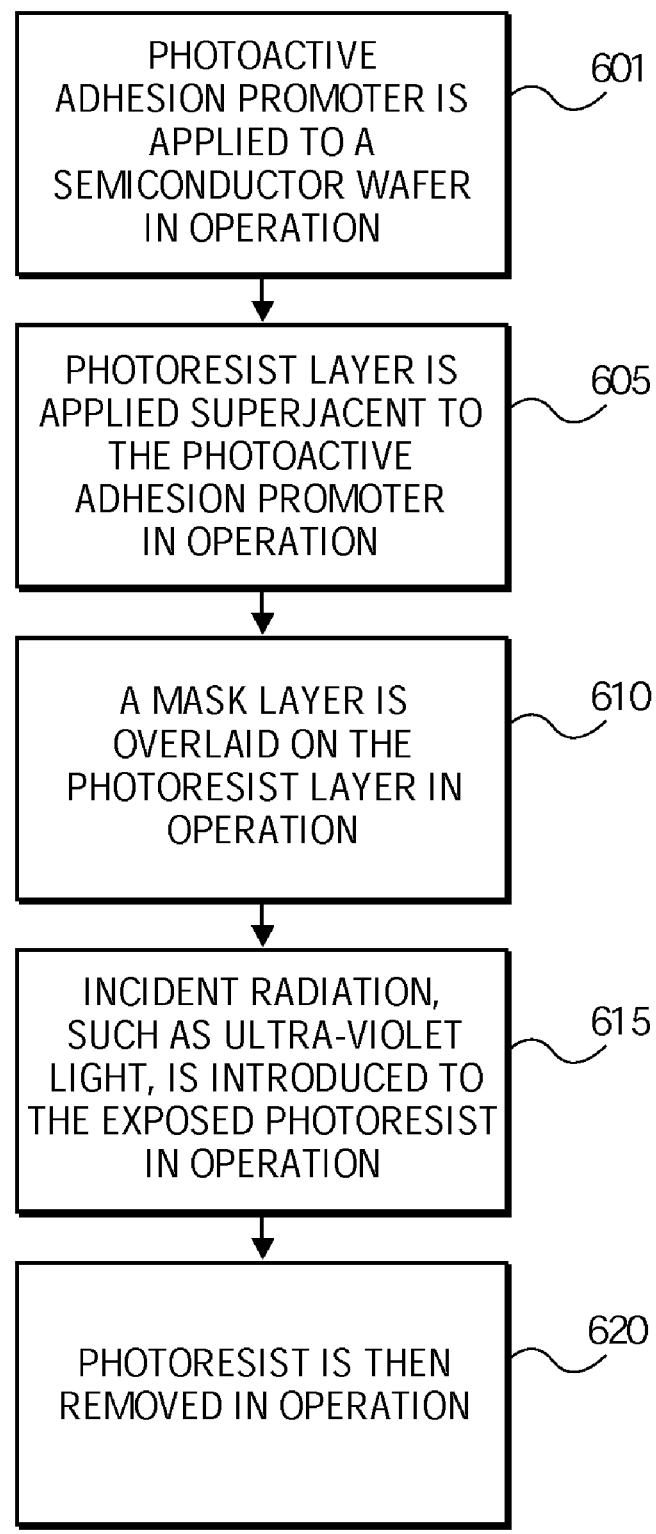
FIG. 6 illustrates process steps for forming and a photoactive adhesion promoter and photoresist layer on a semiconductor substrate according to one embodiment of the invention.

FIG. 6 illustrates a process for forming a photoactive adhesion promoter and a photoresist layer on a semiconductor substrate according to one embodiment of the invention. A photoactive adhesion promoter is applied to a semiconductor wafer in operation 601. A photoresist layer is applied superjacent to the photoactive adhesion promoter in operation 605. A mask layer is overlaid on the photoresist layer in operation 610 and an incident radiation, such as ultra-violet light, is introduced to the exposed photoresist in operation 615. The resulting soluble photoresist is then removed in operation 620 to create a feature profile in the semiconductor device.

Various materials may be used in the embodiments of the invention. For various embodiments of the invention, the substrate surface may be doped silicon, silicon dioxide, or other substrate materials.

While the invention has been described with reference to illustrative embodiments, this description is not intended to be construed in a limiting sense. Various modifications of the illustrative embodiments, as well as other embodiments, which are apparent to persons skilled in the art to which the invention pertains are deemed to lie within the spirit and scope of the invention.

What is claimed is:

1. A photoactive adhesion promoter comprising:
   an adhesion promoter; and
   a photoacid generator linked to the adhesion promoter by a non-cyclic organic chain.

2. The photoactive adhesion promoter of claim 1, wherein the photoacid generator comprises a photon harvesting group.

3. The a photoactive adhesion promoter of claim 2, wherein the photon harvesting group is selected from the group consisting of sulfonium salts and iodonium salts.

4. The photoactive adhesion promoter of claim 2, wherein the photon harvesting group comprises methyldiphenylsulfonium.

5. The photoactive adhesion promoter of claim 2, wherein the photoacid generator further comprises a catalyst group.

6. The photoactive adhesion promoter of claim 5, wherein the catalyst group is selected from the group consisting of nonafluorobutanesulfonate, perfluoroalkylsulfonate, alkylsulfonate, arylsulfonate, alkyl phosphate, aryl phosphate, and fluoroalkylamide.

7. The photoactive adhesion promoter of claim 5, wherein the photon harvesting group comprises methyldiphenylsulfonium and the photon harvesting group is linked to the adhesion promoter by the non-cyclic organic chain.

8. The photoactive adhesion promoter of claim 1, wherein the non-cyclic organic chain is selected from the group consisting of methylene and alkyl.

9. The photoactive adhesion promoter of claim 8, wherein the non-cyclic organic chain includes a side group selected from the group consisting of ether, ester, carbonate, amide, amine, halogen, alcohol, and nitrile.

10. The photoactive adhesion promoter of claim 1, wherein the adhesion promoter is selected from the group consisting of alkoxysilane, silylchloride, phosphate, phosphonate, alkene, thiol, and sulfide.

11. The photoactive adhesion promoter of claim 10, wherein the adhesion promoter comprises trimethoxysilane.

12. The photoactive adhesion promoter of claim 1, wherein the adhesion promoter comprises trimethoxysilane, the photoacid generator comprises methyldiphenylsulfonium and nonafluorobutanesulfonate, and the non-cyclic organic chain links the trimethoxysilane to the methyldiphenylsulfonium.

13. The photoactive adhesion promoter of claim 1, further comprising a photobase generator linked to the adhesion promoter by a second non-cyclic organic chain.

14. A method of creating a photoactive adhesion promoter comprising:

forming alkylsiloxane by combining bromomagnesiummethylphenylphenylsulfide and trimethoxysilylchloride; and treating the alkylsiloxane with methyliodide to form a sulfonium siloxane species.

15. The method of claim 14 further comprising purifying the photoactive adhesion promoter, the purifying comprising recrystallization of the photoactive adhesion promoter.

* * * * *